United States Patent
Delshadpour et al.

(10) Patent No.: US 11,206,160 B2
(45) Date of Patent: Dec. 21, 2021

(54) HIGH BANDWIDTH CONTINUOUS TIME LINEAR EQUALIZATION CIRCUIT

(71) Applicant: NXP B.V., Eindhoven (NL)

(72) Inventors: Siamak Delshadpour, Phoenix, AZ (US); Tong Liu, College Station, TX (US); Samuel Michael Palermo, College Station, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/876,854

(22) Filed: May 18, 2020

(65) Prior Publication Data

US 2021/0359883 A1 Nov. 18, 2021

(51) Int. Cl.
*H04L 25/03* (2006.01)

(52) U.S. Cl.
CPC .. *H04L 25/03885* (2013.01); *H04L 25/03019* (2013.01)

(58) Field of Classification Search
CPC .................. H04L 25/03885; H04L 25/03019
See application file for complete search history.

(56) References Cited

U.S. PATENT DOCUMENTS

| | | | | |
|---|---|---|---|---|
| 5,220,427 A * | 6/1993 | Mikami | ................... | H04N 5/93 348/678 |
| 5,267,071 A * | 11/1993 | Little | ................... | H03G 3/3084 250/214 A |
| 5,347,388 A * | 9/1994 | Little | ................... | H03F 3/082 250/214 A |
| 5,384,501 A | 1/1995 | Koyama et al. | | |
| 5,514,950 A * | 5/1996 | Sevenhans | ............ | H03F 1/3211 323/312 |
| 5,677,646 A | 10/1997 | Entrikin | | |
| 6,023,196 A * | 2/2000 | Ashby | .................. | H03D 7/1433 330/259 |
| 6,369,618 B1 * | 4/2002 | Bloodworth | ............ | G05F 1/562 327/103 |
| 6,819,166 B1 | 11/2004 | Cho et al. | | |
| 7,499,489 B1 | 3/2009 | Ellersick et al. | | |
| 7,532,070 B2 | 5/2009 | Cowley et al. | | |
| 7,804,356 B2 | 9/2010 | Gomez et al. | | |
| 8,391,349 B1 * | 3/2013 | Khalili | .............. | H04L 25/03878 375/232 |
| 8,604,879 B2 | 12/2013 | Mourant et al. | | |
| 8,885,691 B1 * | 11/2014 | Ren | ........................... | G05F 1/10 375/219 |
| 9,172,566 B1 * | 10/2015 | Li | ...................... | H04L 25/03885 |
| 9,281,974 B1 * | 3/2016 | Liu | ...................... | H03F 3/45201 |
| 9,374,217 B1 * | 6/2016 | Forey | ...................... | H03L 7/087 |

(Continued)

OTHER PUBLICATIONS

U.S. Appl. No. 16/876,970, filed May 18, 2020, entitled Continuous Time Linear Equalization Circuit. The Examiner is referred to the copending patent prosecution of the common Applicant (No attachment).

(Continued)

*Primary Examiner* — Berhanu Tadese

(57) ABSTRACT

A high bandwidth continuous time linear equalization (HBCTLE) circuit is disclosed. The HBCTLE circuit includes a continuous time linear equalization (CTLE) circuit and a gain circuit coupled with an output of the CTLE circuit. A feedback circuit is coupled between the output of the CTLE circuit and an output of the gain circuit.

15 Claims, 6 Drawing Sheets

(56) References Cited

U.S. PATENT DOCUMENTS

| | | | |
|---|---|---|---|
| 9,432,230 B1 | 8/2016 | Chang | |
| 9,473,330 B1* | 10/2016 | Francese | H04L 25/03267 |
| 9,602,314 B1* | 3/2017 | Chang | H04L 25/0272 |
| 9,654,310 B1* | 5/2017 | Chang | H04L 25/03057 |
| 9,705,708 B1* | 7/2017 | Jin | H04L 25/03885 |
| 9,917,607 B1* | 3/2018 | Zhang | H03G 3/3078 |
| 9,954,503 B2* | 4/2018 | Arai | H03G 1/0029 |
| 10,075,141 B1* | 9/2018 | Nagulapalli | H03F 3/193 |
| 10,263,815 B1* | 4/2019 | Geary | H03F 3/45197 |
| 10,341,145 B2* | 7/2019 | Musah | H04L 25/03019 |
| 10,447,507 B1* | 10/2019 | Zhang | H04L 25/03019 |
| 10,608,848 B1* | 3/2020 | Azenkot | H04L 25/03057 |
| 10,637,695 B1* | 4/2020 | Venkatesan | H04L 27/01 |
| 10,658,016 B1* | 5/2020 | Chang | G11C 7/1072 |
| 10,691,150 B1* | 6/2020 | Delshadpour | H03K 19/08 |
| 10,763,865 B1* | 9/2020 | Badizadegan | H03L 7/085 |
| 10,826,502 B1* | 11/2020 | Badizadegan | H03L 7/085 |
| 10,924,307 B1* | 2/2021 | Zhang | H03K 17/60 |
| 2004/0193669 A1* | 9/2004 | Shirani | H04L 25/0292 708/819 |
| 2007/0013445 A1* | 1/2007 | Fornasari | H03F 1/26 330/282 |
| 2007/0030092 A1 | 2/2007 | Yeung et al. | |
| 2008/0101450 A1 | 5/2008 | Wu et al. | |
| 2011/0235695 A1* | 9/2011 | Lin | H04L 25/03076 375/232 |
| 2011/0317751 A1 | 12/2011 | Roethig et al. | |
| 2012/0049946 A1* | 3/2012 | Boecker | H03F 3/45632 327/559 |
| 2012/0121004 A1* | 5/2012 | Chang | H03H 7/40 375/232 |
| 2012/0188014 A1* | 7/2012 | Rane | H04B 3/00 330/254 |
| 2012/0299617 A1* | 11/2012 | Zhang | H04L 25/0298 326/30 |
| 2013/0215954 A1* | 8/2013 | Beukema | G06G 7/184 375/233 |
| 2013/0322506 A1* | 12/2013 | Zerbe | H04L 27/01 375/224 |
| 2014/0203839 A1* | 7/2014 | Mandal | H04L 25/03885 326/30 |
| 2015/0049797 A1* | 2/2015 | Asmanis | H04L 25/03006 375/232 |
| 2015/0146771 A1* | 5/2015 | Walter | H04L 25/03885 375/232 |
| 2015/0180582 A1* | 6/2015 | Zhou | H04B 10/564 398/182 |
| 2015/0288545 A1* | 10/2015 | Schell | H04L 25/03057 375/233 |
| 2015/0295736 A1* | 10/2015 | Bulzacchelli | H04L 25/03057 375/233 |
| 2015/0319020 A1* | 11/2015 | Song | H04L 25/061 345/204 |
| 2016/0013955 A1* | 1/2016 | Dong | H04L 25/03019 375/317 |
| 2016/0020740 A1* | 1/2016 | Arcudia | H03F 3/45197 330/261 |
| 2016/0065395 A1* | 3/2016 | Song | H04L 25/49 375/232 |
| 2016/0173289 A1* | 6/2016 | Islam | H04L 25/0296 375/233 |
| 2016/0173299 A1* | 6/2016 | Islam | H04L 25/0296 375/233 |
| 2016/0277219 A1* | 9/2016 | Venkatram | H04L 7/0062 |
| 2016/0352557 A1* | 12/2016 | Liao | H04L 27/3809 |
| 2017/0126443 A1* | 5/2017 | Gu | H03F 3/193 |
| 2018/0024175 A1* | 1/2018 | Quan | H04R 29/001 398/193 |
| 2018/0048494 A1* | 2/2018 | Mobin | H04L 25/03057 |
| 2018/0097139 A1* | 4/2018 | Li | H01L 31/107 |
| 2018/0198647 A1 | 7/2018 | Norimatsu | |
| 2018/0234096 A1* | 8/2018 | Li | H03F 3/082 |
| 2018/0288548 A1* | 10/2018 | Quan | H04R 29/001 |
| 2018/0342997 A1* | 11/2018 | Maeda | H03F 3/04 |
| 2019/0253284 A1* | 8/2019 | Jalali Far | H03H 7/38 |
| 2019/0305810 A1* | 10/2019 | Pham | H04B 1/123 |
| 2020/0036563 A1* | 1/2020 | Talbot | H02H 9/045 |
| 2020/0153395 A1* | 5/2020 | Geng | H03K 5/003 |
| 2020/0162175 A1* | 5/2020 | Kimmitt | H04B 17/336 |
| 2020/0313840 A1* | 10/2020 | Den Besten | H04L 5/1469 |

OTHER PUBLICATIONS

U.S. Appl. No. 16/876,691, filed May 18, 2020, entitled Continuous Time Linear Equalization Circuit With Programmable Gains. The Examiner is referred to the copending patent prosecution of the common Applicant (No attachment).

Zhang, G. E. et al. "A 10 GB/s BiCMOS Adaptive Cable Equalizer", IEEE Journal of Solid-State Circuits, vol. 40, No. 11, pp. 2132-2140 (Nov. 2005).

Lee, J. "A 20-GB/s Adaptive Equalizer in 0.13-µm CMOS Technology" IEEE Journal of Solid-State Circuits, vol. 41, No. 9, pp. 2058-2066 (Sep. 2006).

Gondi, S. et al. "Equalization and Clock and Data Recovery Techniques for 10-GB/s CMOS Serial-Link Receivers", IEEE Journal of Solid-State Circuits, vol. 42, No. 9, pp. 1999-2011 (Sep. 2007).

Liu, H. et al. "A 5-Gb/s Serial-Link Redriver With Adaptive Equalizer and Transmitter Swing Enhancement", IEEE Transactions on Circuits and Systems-1: Regular Papers, vol. 61, No. 4, pp. 1001-1011 (Apr. 2014).

Sahni, P. S. et al. "An Equalizer With Controllable Transfer Function for 6-Gb/s HDMI and 5.4-Gb/s DisplayPort Receivers in 28-nm UTBB-FDSOI", IEEE Transactions on Very Large Scale Integration (VLSI) Systems, vol. 24, No. 8, pp. 2803-2807 (Aug. 8, 2016).

Rahman, W. et al. "A 22.5-to-32-GB/s 3.2pJ/b Referenceless Baud-Rate Digital CDR with DFE and CTLE in 28nm CMOS", IEEE International Solid-State Circuits Conference, pp. 120-121 (2017).

Depaoli, E. et al. "A 64 GB/s Low-Power Transceiver for Short-Reach PAM-4 Electrical Links in 28-nm FDSOI CMOS", IEEE Journal of Solid-State Circuits, vol. 54, No. 1, pp. 6-17 (Jan. 2019).

Non-Final Rejection for U.S. Appl. No. 16/876,691, 11 pgs., dated Oct. 16, 2020.

Liu, H. et al. "An HDMI Cable Equalizer With Self-Generated Energy Ratio Adaptation Scheme", IEEE Transactions on Circuits and Systems-II: Express Briefs, vol. 56, No. 7, pp. 595-599 (Jul. 2009).

Notice of Allowance for U.S. Appl. No. 16/876,691, 8 pgs. (dated Nov. 25, 2020).

Final Rejection for U.S. Appl. No. 16/876,691, 17 pgs. (dated Nov. 10, 2020).

Non-Final Rejection for U.S. Appl. No. 16/876,970, 10 pgs., (dated Feb. 24, 2021).

Non-Final Rejection for U.S. Appl. No. 16/876,970, 14 pgs., dated Mar. 22, 2021.

Non-Final Rejection for U.S. Appl. No. 16/876,970, 10 pgs., (dated Jul. 12, 2021).

Notice of Allowance dated Oct. 4, 2021 in U.S. Application No. 16/876,970.

Balachandran, A., "0.058 nm 16Gbit/s inductorless analogue equaliser with low-frequency equalisation compensating 15 dB channel loss", Electronics Letters, IEE Stevenage GB, vol. 54, No. 2, Jan. 25, 2018.

He, J., "A 2nd Order CTLE in 130nm SiGe BiCMOS for a 50GBaud PAM4 Optical Driver", 2018 IEEE Conference on International Circuits, Technologies and Applications, May 3, 2019.

Itoh, Y., "L-Band SiGe HBT Active Differential Equalizers Providing Variable Positive or Negative Gain Slopes", 2016 21st International Conference of Microwave, Radar and Wireless Communications (MIKON), May 9, 2016.

Itoh, Y., "L-Band SiGe HBT Active Differential Equalizers with Variable Inclination and Position of the Positive or Negative Gain Slopes", Proceedings of the 46th European Microwave Conference, Oct. 4, 2016.

(56) References Cited

OTHER PUBLICATIONS

Parikh, S., "A 32 Gb/s Wireline Receiver with a Low-Frequency Equalizer CTLE and 2-Tap DFE in 28nm CMOS", OSSCC 2013 Session 2, Ultra-High-Speed Transceivers and Equalizers 2.1, Feb. 17, 2013.

* cited by examiner

HIGH BANDWIDTH CONTINUOUS TIME LINEAR EQUALIZATION CIRCUIT

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO) and any other high-speed wide band wired communication require stages of processing within their electronic circuitry. Wide band data communications system circuitry can include several stages including modules to equalize, amplify and/or re-drive signals for every data channel. Usually one stage cannot provide enough gain or equalization. In such multi-stage systems, the use of intermediate buffers between each stage may be necessary. Oftentimes, however, the buffer consumes even more power than the equalizer, amplifier and drivers, which makes a design with less buffer blocks more favorable in the system, especially for use in low voltage (i.e., ~1.8V or lower) systems. What are needed is an efficient a continuous time linear equalization circuit (CTLE).

SUMMARY

In one embodiment, a high bandwidth continuous time linear equalization (HBCTLE) circuit is disclosed. The HBCTLE includes a continuous time linear equalization (CTLE) circuit and a gain circuit coupled with an output of the CTLE circuit. A feedback circuit is coupled between the output of the CTLE circuit and an output of the gain circuit.

In some examples, the gain circuit includes a first transistor pair. The gates of the transistors in the first transistor pair are coupled with the output of the CTLE circuit. The feedback circuit includes a second transistor pair. The gates of the transistors in the second transistor pair are coupled with the output of the gain circuit. In one example, the feedback circuit includes a third transistor pair. The gates of the transistors in the third transistor pair are coupled with the second transistor pair. In another example, the feedback circuit includes a third transistor pair. The gates of the transistors in the third transistor pair are coupled with the second transistor pair through a low pass filter.

In some examples, the transistors in the first transistor pair are coupled together through a degeneration impedance. In one example, the transistors in the second transistor pair are coupled together through a variable degeneration impedance. The transistors in the second transistor pair are coupled to a low pass filter.

In some examples, the HBCTLE circuit includes a third transistor pair coupled to the low pass filter such that the output of the low pass filter is coupled to the gates of the transistors of a third transistor pair. The third transistor pair is coupled with the output of the CTLE circuit.

In some examples, the feedback circuit is configured to provide a variable feedback factor depending on the value of a variable degeneration resistor coupled between the transistors of the second transistor pair. The CTLE circuit includes a transistor and a CTLE resistor. The CTLE resistor is coupled between the transistor and supply voltage. The feedback circuit is configured such that at a frequency above a predetermined threshold, an output load impedance of the CTLE circuit is approximately equal to a value of the resistor. In some examples, the CTLE circuit includes a passive CTLE section and an active CTLE section. The active CTLE section includes a degenerative impedance of an order higher than one.

BRIEF DESCRIPTION OF THE DRAWINGS

Throughout the description, similar reference numbers may be used to identify similar elements.

DETAILED DESCRIPTION

Figure 1:
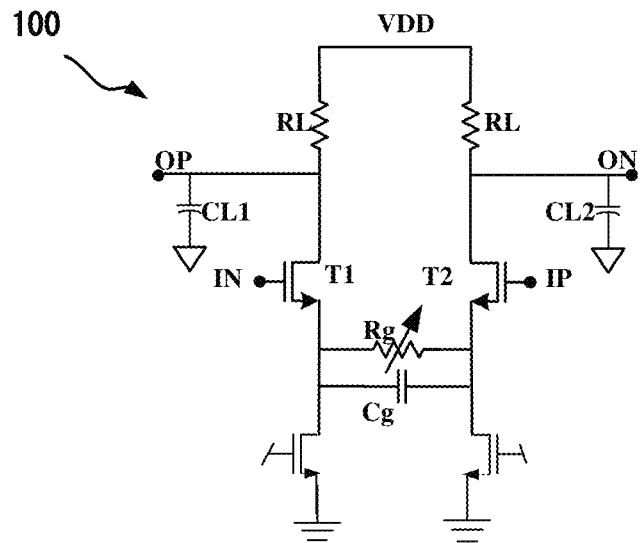
FIG. 1 shows a conventional continuous time linear equalization (CTLE) circuit.

It will be readily understood that the components of the embodiments as generally described herein and illustrated in the appended Figs. could be arranged and designed in a wide variety of different configurations. Thus, the following more detailed description of various embodiments, as represented in the Figs., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

One or more embodiments described herein use a higher order degeneration impedance to provide well controlled higher channel loss compensation. Further, a higher order degeneration raises and roll off of CTLE frequency response (i.e., equally faster out of band attenuation, which suppresses more out of band noises and sharper in band increase).

Degeneration impedance can be 2nd, 3rd, $4^{th}$ or any custom order/shape to achieve the required channel loss compensation. The use of higher order degeneration impedance does not impact the maximum gain of CTLE, but adding more low frequency loss will increase the peaking gain by definition (difference between DC gain and AC gain at Nyquist frequency). At Gb/s data rates, the skin effect and dielectric loss of the transmission channel cause frequency-dependent loss, thus resulting in inter-symbol interference (ISI). As computing systems become faster than ever, signal integrity has also become a critical issue for designers due to the rapidly deteriorated inter-symbol interference (ISI) in slower transmission media and systems. Transmission of off-chip data at high frequencies results ISI due to the bandwidth limitation of the channel used. It results in a significant attenuation at high frequencies, hence degrades the performance and increases bit error rate (BER). To overcome these limitations, equalizers are used in high speed serial links. U.S. Pat. No. 10,447,507 by Xu Zhang et al entitled "LOW SUPPLY LINEAR EQUALIZER WITH PROGRAMMABLE PEAKING GAIN", which is incorporated herein by reference, describes a linear equalizer. US Pat. Pub. US20080101450A1 by Wu entitled "SECOND ORDER CONTINUOUS TIME LINEAR EQUALIZER", which is incorporated herein by reference, describes various examples of a CTLE.

A CTLE is employed at the receiver (RX) front end to compensate the channel loss and provide an equalized low-jitter output data. Further, the linear equalizer ensures the precursor as well as postcursor equalization as against the nonlinear equalizing techniques like the decision-feedback equalization (DFE), which realizes only postcursor equalization. Longer cable or connecting paths on a printed circuit board (PCB) means more insertion loss at certain frequencies. The primary function of a CTLE circuit is compensation of the loss. A CTLE will compensate the loss and provides a fairly flat gain in the frequency bandwidth of interest.

One or more embodiments described herein provide higher peaking gain for a CTLE. A gain stage is used after CTLE as a boost to CTLE peaking gain and another zero to provide an extra zero for a sharper CTLE response (which in combination with higher peaking gain, provides higher channel loss compensation). The combined CTLE and gain stage with a feedback loop, provides programmable DC gain which is equal to programmable peaking gain. The CTLE stage provides the coarse gain steps while feedback loop provides fine gain steps. The feedback loop provides frequency dependent impedance as load of the CTLE which provides DC gain and boost peaking gain.

FIG. 1 shows a conventional CTLE circuit 100. The conventional CTLE circuit 100 includes input ports IN, IP and output ports OP, ON. The output port OP is coupled to a capacitor CL1 that is coupled to ground. Similarly, the output port ON is coupled to a capacitor CL2 that is coupled to ground. The input port IN is coupled with the gate of a transistor T1 and the input port IP is coupled with the gate of a transistor T2. A terminal of the transistor T1 and the transistor T2 are coupled together via a variable resistor Rg and a capacitor Cg. The resistor Rg and the capacitor Cg are coupled with each other in parallel.

An equalizer realizes a transfer function which can be tuned such that it is inverse of the channel transfer function. If properly tuned, the equalizer improves the receiver performance parameters, such as BER and jitter tolerance. A conventional capacitive source-degenerated first-order CTLE, as shown in FIG. 1, with one zero and two poles, provides limited capability to control the shape of CTLE transfer function. Poles and Zeros of a transfer function are the frequencies for which the value of the denominator and numerator of transfer function becomes zero respectively. The values of the poles and the zeros of a system determine whether the system is stable, and how well the system performs. In a conventional CTLE, the DC gain, transfer function and maximum (peak) gain can be defined as:

$$Adc = 2R_L/(Rg + 2/g_m) \qquad (1)$$

$$H(s) \approx Adc(1 + sRgCg)/((1 + sRgCg/(1 + g_mRg/2)(1 + s RLCL)) \qquad (2)$$

$$Apk = g_m * R_L \qquad (3)$$

where $g_m$ is transconductance of differential pair transistors T1, T2. Equation 1 shows that Rg adjustment will change DC gain and zero location. However, It is difficult to get high peaking gain and equal gain steps from this conventional CTLE circuit 100 without adding multiple stages of the convention CTLE in series. However, adding multiple stages may consume more power and take more space on a device.

Figure 3:
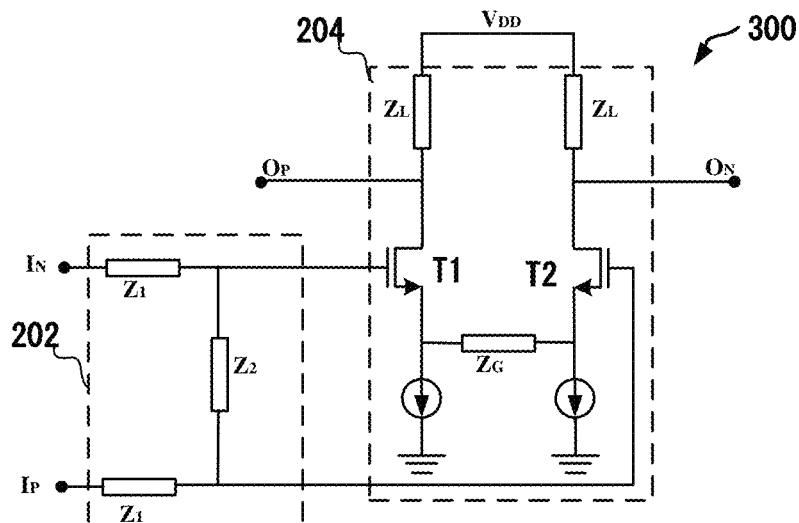
FIG. 3 depicts a CTLE circuit in accordance with one or more embodiments.

Although a CMOS based circuit is shown in FIG. 3, the circuit of FIG. 3 may also be implemented using a BJT based circuit. For the conventional CTLE circuit 100, the tuning can be done by changing different source degeneration resistor for CMOS circuit or emitter degeneration resistor for BJT circuit. The DC attenuation will be changed while the peaking gain is fixed (Peaking gain=$g_m*R_L$). In addition, when the degeneration resistor is changed, the peaking frequency changes because the zero created by degeneration RC pair ($\omega_{zero}$=1/Rg Cg) while the capacitor is fixed. To keep the peak frequency fixed, Rg and Cg are tuned/adjusted to get different peaking gain and maintain the same peaking frequency. For high speed applications, the tuning method of the conventional CTLE circuit 100 can cause problems. Due to parasitic components of the circuit, using discrete tuning steps, means there should be different resistor and capacitor settings for each step.

Figure 2:
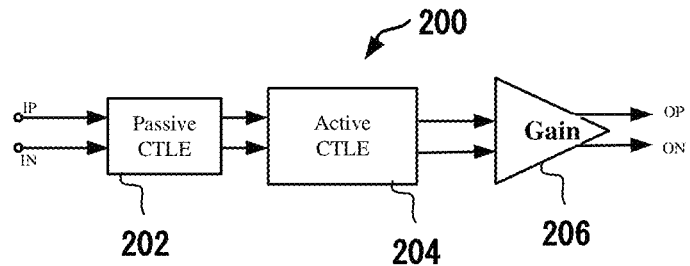
FIG. 2 shows a block diagram of a CTLE circuit in accordance with one or more embodiments.

FIG. 2 shows a CTLE 200 that is a combination of a passive CTLE 202 and an active CTLE 204. A gain stage 206 may be added at the output stage of the active CTLE 204. Adding a passive CTLE 202 to an active CTLE 204 may cause low frequency loss but will also provide extra poles and zeros to AC response of the CTLE 200 that provides extra AC loss compensation. The gain stage 206 compensate for the DC loss. In some embodiments, if the DC loss is within tolerable limits, the gain stage 206 may be omitted.

FIG. 3 shows a CTLE circuit 300 that includes a passive CTLE 202 including Z1 and Z2 coupled to the input ports $I_N$, $I_P$, and an active CTLE 204 including a differential transistor pair T1, T2. The active CTLE also includes impedances $Z_G$ and $Z_L$. The active CTLE includes output ports $O_P$, $O_N$. Supply $V_{DD}$ is coupled to impedances $Z_L$. $Z_L$ may be a pure resistive impedance or may also be a higher order impedance including an inductor. The output of the passive CTLE drives the gates of the transistors T1, T2.

Peak gain of the CTLE 300, as defined by Equation 3 does not change by $Z_G$ impedance and DC gain as defined by Equation 4 does not change with the AC components of the impedance $Z_G$.

$$H(s) \sim g_m Z_L/(1+g_m*Z_G) \qquad (4)$$

Increasing the resistive part of the degeneration impedance $Z_G$ will reduce the DC gain but will increase the peak gain. Pole(s) and zero(s) can be adjusted in a way that a higher bandwidth is achievable. A known ratio between high frequency and low frequency spectrum of the input signal in a desired bandwidth may be achieved by adjusting the values of impedance components of the CTLE 300. Making $Z_G$ a "higher order" impedance increases positive and negative slope of CTLE curve (equally higher channel loss compensation and more out of band suppression). The higher order impedance can be implemented by adding an inductor to $Z_G$.

Figure 4A:
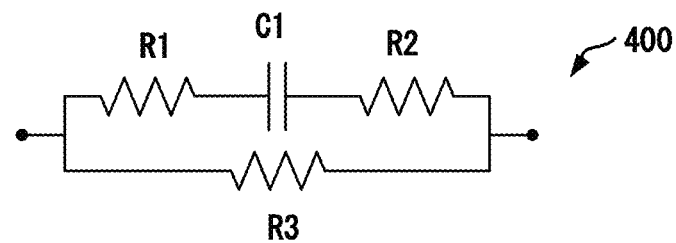
FIGS. 4A-4C show embodiments of degeneration impedance circuits for the CTLE circuit of FIG. 3 in accordance with one or more embodiments.
Figure 4B:
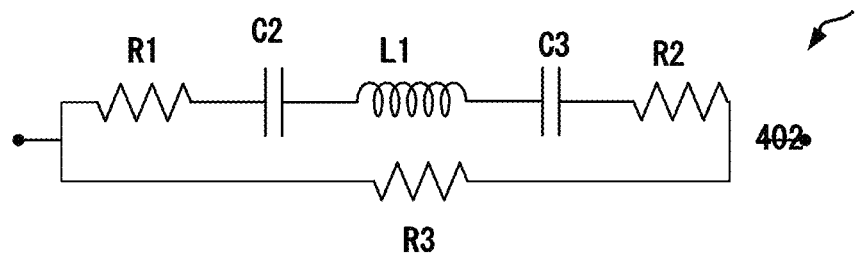
Figure 4C:
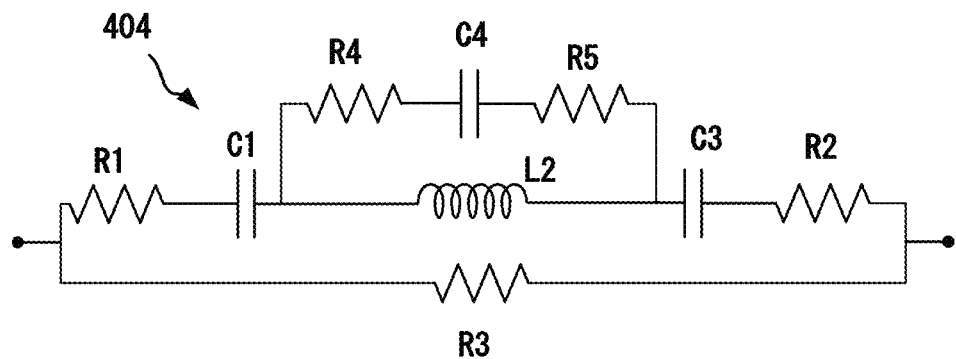

FIGS. 4A, 4B, 4C shows realistic implementations of $Z_G$ in various embodiments. FIG. 4A shows a first order impedance implementation 400 of $Z_G$. Accordingly, $Z_G$ 400 includes a resistor R1 coupled to a capacitor C1 in series and the capacitor C1 coupled with a resistor R2 in series. The series including R1, C1 an R2 is coupled to a resistor R3 in parallel. FIG. 4B provides a second order impedance implementation 402 of $Z_G$ in which the capacitor C1 is replaced by a series of a capacitor C2, an inductor L1 and a capacitor C3. FIG. 4C shows a third order impedance implementation 404 of $Z_G$. In the third order impedance implementation 404, the inductor L1 (in FIG. 4B) is replaced by a series of a resistor R4, a capacitor C4 and a resistor R5 coupled to an inductor L2 in parallel.

Generally, the gain of the CTLE circuit 300 may be defined as follows:

Gain=$gm*Z_L/(1+gmZ_G)$, where $Z_G=Z(s)$ defines the degeneration impedance order. If $Z(s)=R$, the order=0. If $Z(s)=R\|sC$ or R+sC, the order=1. If $Z(s)=R+sL+1/sC=$ ($sRC+s^2LC+1$)/sC, the order=2. In general, $Z(s)=k(1+as+bs^2+cs^3+\ldots)$ defines the order of impedance.

The passive CTLE 202 practically performs as a passive filter with a desired AC response. The transfer function of the passive CTLE may be represented as:

$$OUT/IN=Z_2/(Z_1+Z_2) \qquad (5)$$

Figure 4D:
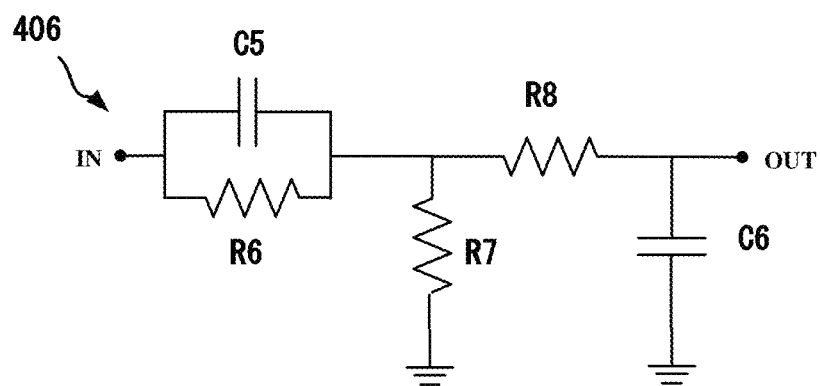
FIGS. 4D-4E show embodiments of passive CTLE circuits for the CTLE circuit of FIG. 3 in accordance with one or more embodiments.

FIG. 4D shows a single ended form of passive CTLE circuit 406 in one embodiment. Accordingly, the passive CTLE circuit 406 includes a capacitor C5 coupled with a resister R6 in parallel and one terminal of the capacitor C5 coupled with the input port. The capacitor C5 is coupled with a resistor R7 and the resistor R7 is also coupled with ground. The resistor R7 is coupled with a resistor R8 and the resistor R8 is coupled with a capacitor C6. The capacitor C6 is coupled with ground on one end and to the output port on the other end.

Figure 4E:
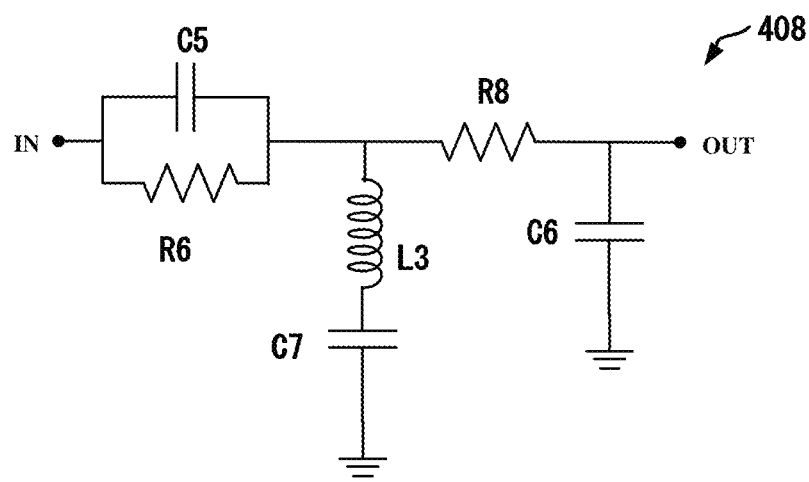

FIG. 4E shows the passive CTLE circuit 408 which provide a higher order impedance than the passive CTLE circuit 406. In the passive CTLE circuit 408, the resistor R7 is replaced by a capacitor C7 coupled with an inductor L3 in series. In some other embodiments, a resistor may also be added to the combination of the capacitor C7 and the inductor L3.

Figure 5:
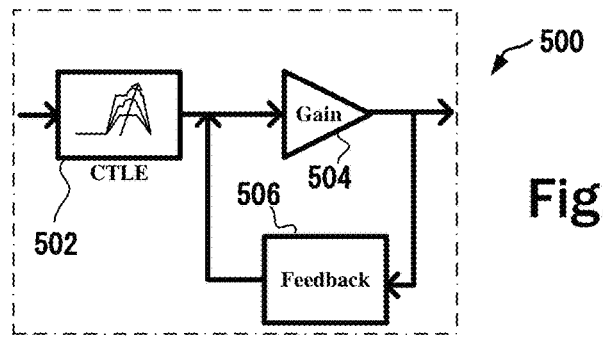
FIG. 5 shows a schematic of a high bandwidth CTLE in accordance with one or more embodiments.

FIG. 5 shows a high bandwidth CTLE 500 that includes a CTLE 502. The CTLE 502 can be the active CTLE 204. In some examples, the conventional CTLE 100 may also be used. The high bandwidth CTLE 500 includes a gain circuit 504 and a feedback circuit 506.

The transfer function of the gain circuit 504 and the feedback circuit 506 can be represented as:

$$H(s)=G(s)/(1+\beta \cdot G(s))$$

Where $\beta$ is the feedback factor of the feedback circuit 506 and G(s) is the gain of the gain circuit 504.

Making the feedback factor, $\beta$, a frequency dependent component helps to shape CTLE response curve. When $\beta$ is very small, H(s) is approximately equal to G(s), which means the transfer function of the gain circuit 504 is not affected by the feedback loop, if $\beta$ small. Because of the low pass filter in the feedback circuit 506, the high frequency feedback factor is also small, therefore H(s) is approximately equal to G(s) holds for the whole desired frequency range. The gain circuit 504 with the feedback circuit 506 provides a frequency dependent impedance load for the CTLE 502. The gain circuit 504 compensates for the DC attenuation of the CTLE 502 so that the input signal can be amplified. The feedback circuit 506 may include a low-pass filter, so that the high frequency signal is attenuated in the feedback loop while the high frequency response of the CTLE 502 remains unchanged. For the low frequencies, the feedback factor $\beta$ is set to be small to have H(s) approximately equal to G(s). For the CTLE 502, the feedback loop formed using the feedback circuit 506 will change the load resistance so that the DC gain will change.

Figure 6:
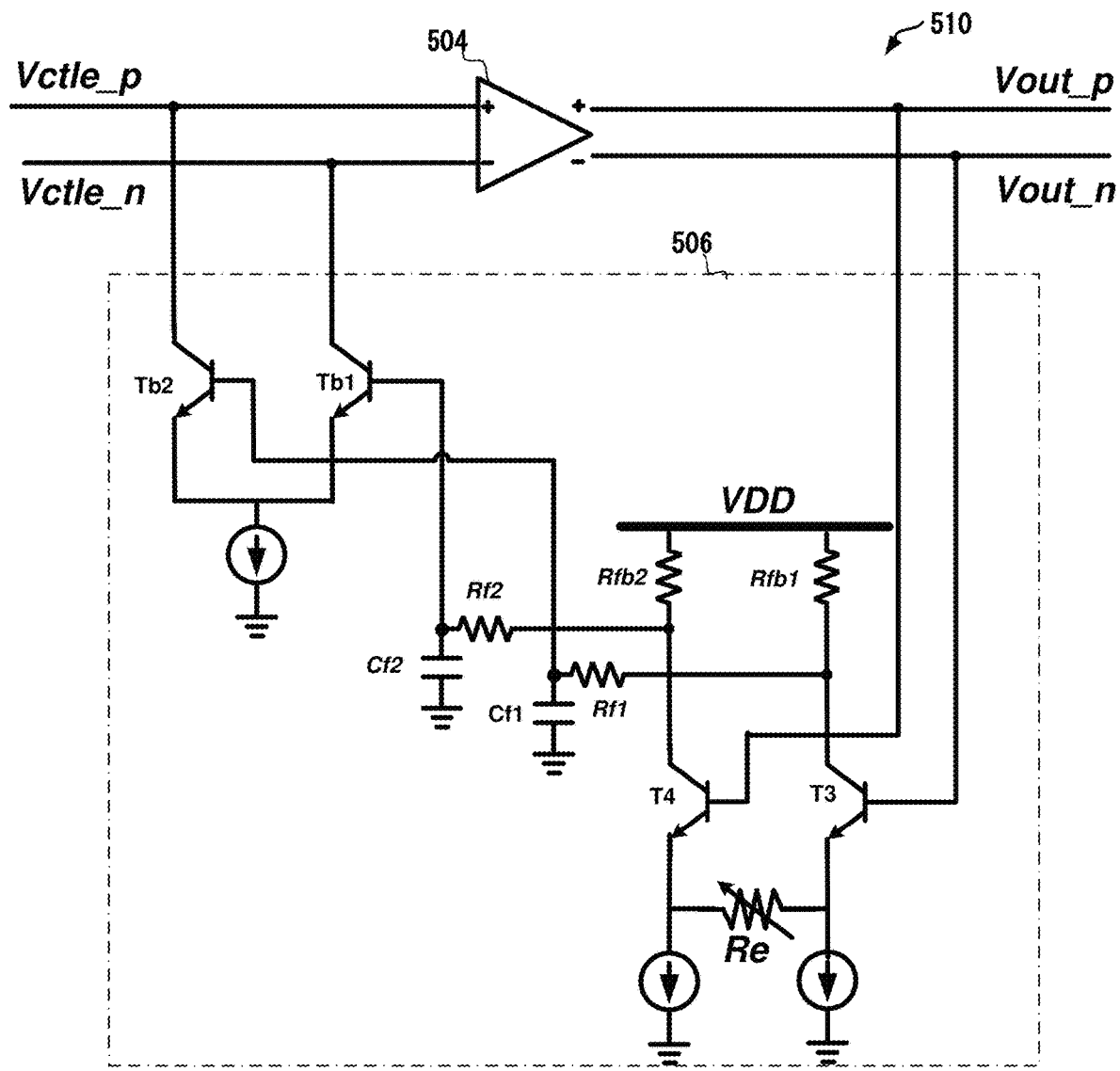
FIG. 6 shows a circuit for a feedback loop in accordance with one or more embodiments.

FIG. 6 shows a sample circuit for a feedback loop 510 including the gain circuit 504 and the feedback circuit 506. The gain circuit 504 may be an amplifier with a gain $A_{main}$. The feedback loop 510 is explained in detailed in FIG. 7. One characteristic of the feedback loop 510 is that no current flows through the gain circuit 504 via Vctle_p/Vctle_n. No current to gain circuit means that collectors of transistors Tb1 and Tb2 will manage the extra current being sinked from nodes Vctle_p/Vctle_n, equally the equal impedance that can be seen there. This make output of the CTLE 502 in FIG. 6 less sensitive to parasitic effects of gain circuit 504.

Figure 7:
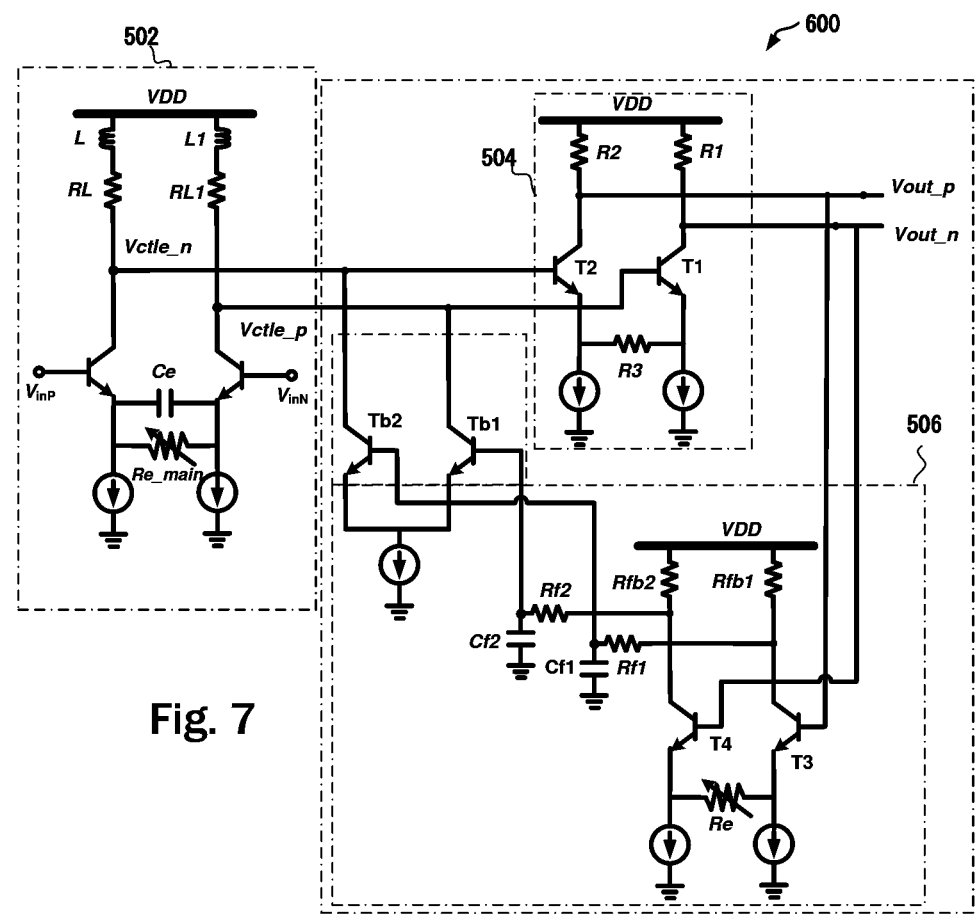
FIG. 7 shows a circuit for a high bandwidth CTLE in accordance with one or more embodiments.

FIG. 7 shows a high bandwidth CTLE circuit 600. As shown, the high bandwidth CTLE circuit 600 is implemented using BJTs. In other examples, the high bandwidth CTLE circuit 600 may also be implemented using NMOS or PMOS.

As shown, the high bandwidth CTLE circuit 600 includes a plurality of transistor pairs, e.g., T1/T2, T3/T4, Tb1/Tb2. In some examples, both transistors in each pair have the same or similar structure and are of the same type. Both transistors in each pair have same design specifications, same dimensions and are made from the same substrate material with the same processing technology. Transconductances of both transistors in each pair are the same or substantially the same.

The high bandwidth CTLE circuit 600 includes a CTLE 502. The output of the CTLE 502 is coupled with the input of the gain circuit 504. The gain circuit 504 includes transistors T1, and T2. The gates of the transistors T1 and T2 are driven by the output of the CTLE 502. The circuit coupled between the supply $V_{DD}$ and Vout_n output includes a resistor R1. A mirror branch, from supply $V_{DD}$ to and Vout_p includes a resistor R2. The emitter of Transistors T1 and T2 are coupled together through a resistor R3.

The feedback circuit 506 includes a transistor T3 and a resistor Rfb1. A mirror branch includes a transistor T4 and a resistor Rfb2. Emitter of T3 and T4 transistors are coupled through a resistor Re. The resistor Re may be a variable resistor. The bases of the transistors T3 and T4 are driven by the output (Vout_p, Vout_n) of the gain circuit 504. The feedback circuit 506 also includes transistors Tb1, Tb2. The bases of the transistors Tb1 and Tb2 are driven by the output of a low-pass filter including resistors Rf1, Rf2 and capacitors Cf1, Cf2. The resistor Rf1 is coupled with a terminal of the transistor T3 and the resistor Rf2 is coupled with a terminal of the transistor T4. Terminals of the transistor Tb1, Tb2 are coupled with the output of the CTLE 502. The CTLE 502 includes a transistor pair coupled between $V_{DD}$ and ground in parallel. The two transistors are coupled together through a degeneration impedance including a capacitor Ce and a resistor Re_main. An inductor L and a resistor RL is are coupled between a transistor in the input pair transistors and $V_{DD}$. A mirror branch may include an inductor L1 which is equal in value to the inductor L and a resistor $R_{L1}$ which is equal in value to the resistor $R_L$. Similarly, R1=R2, Rf1=Rf2 and Rfb1=Rfb2. The CTLE circuit 502 includes input ports $V_{inP}$, $V_{inN}$ and output ports Vctle_n, Vctle_p. Vctle_n drives the transistor T2 and Vctle_p drives the transistor T1. The feedback loop on the output stage of a CTLE acts as a well control load and helps to shape CTLE's AC response.

The impedance seen at the output of CTLE 502 may be represented by the following equations ($g_{m1}$ is transconductance of transistor T1 and $g_{mfb1}$ is transconductance of transistor Tb1):

$$Z(s)=(1+s(R_{f1}+R_{fb1})\cdot C_{f1})/(A_{main}\cdot G_{m1}\cdot g_{mfb1}) \quad (6)$$

$$G_{m1}=g_{m1}/(1+g_{m1}\cdot Re) \quad (7)$$

Where $A_{main}$ is gain of the gain circuit 504. If "$g_{m1}\cdot Re \gg 1$", then "$G_{m1}=1/Re$" and "$Z(s)=(1+s(R_{f1}+R_{fb1})\cdot Cf1)/(A_{main}\cdot G_{m1}\cdot g_{mfb1})R_e$". At high frequencies, because of the zero in the Z(s), the impedance can be very large. At low frequencies, Z(s) is a relatively small value. For the CTLE 502, the output load impedance is, "Zout(s)=$R_L$∥Z(s)". Hence, for a low frequency signal, the "Zout(s)" becomes relatively small because the low value of the Z(s) is smaller at lower frequencies. At high frequencies (i.e., a frequency above a predetermined threshold), Z(s) is high enough to make Zout(s) which results in a larger gain. Another advantage of having the gain circuit 504 and the feedback circuit 506 is that at low frequencies, when $R_L \gg Z(s)$, then Zout(s)~Z(s), when $g_{m1}\cdot R_e \gg 1$, "$Z(s)=(1+s(R_{f1}+R_{fb1})\cdot Cf1)/(A_{main}\cdot G_{m1}\cdot g_{mfb1}) R_e$", hence Zout(s)~Re. Therefore, a linear tuning of CTLE DC gain is possible.

Figure 8:
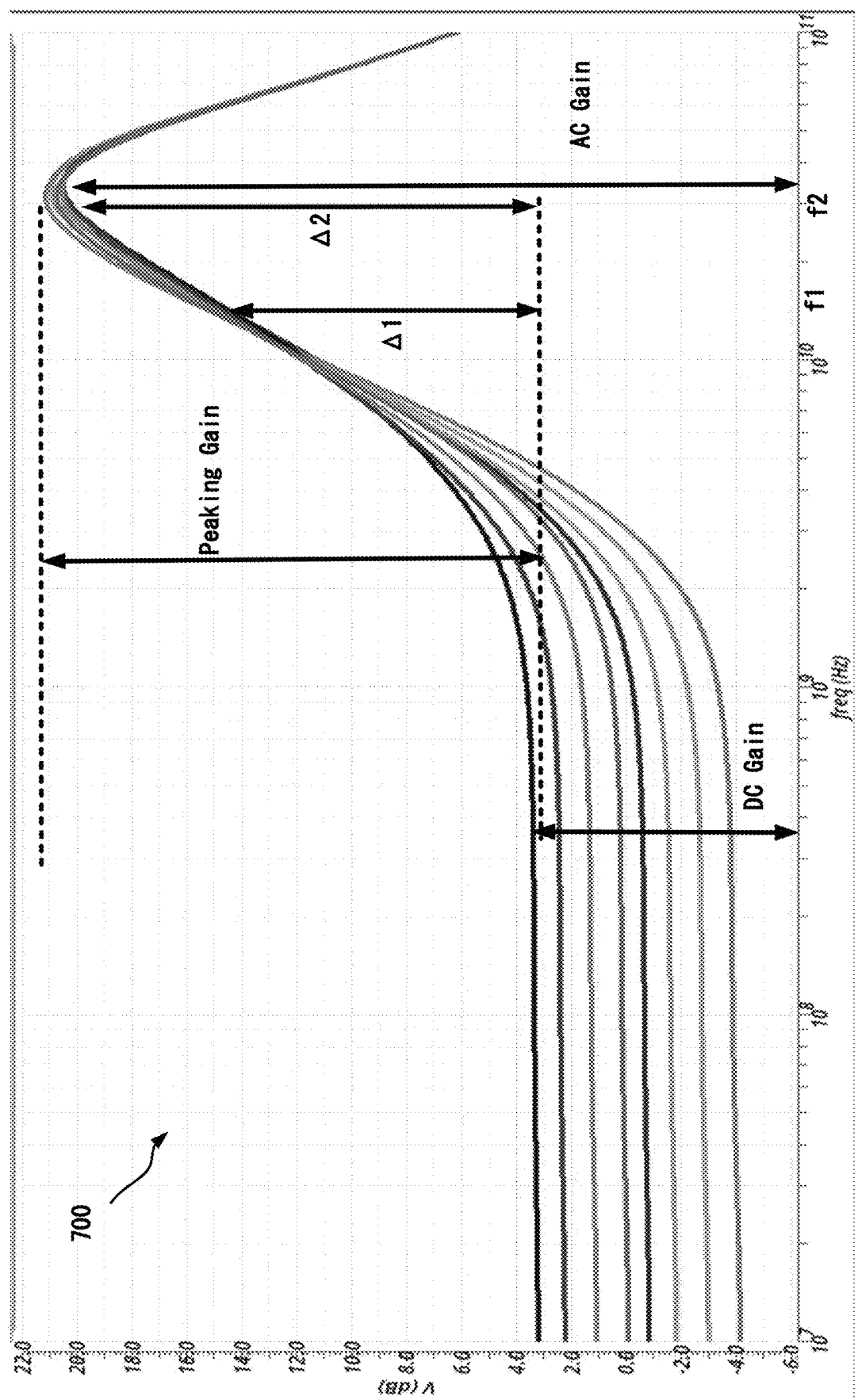
FIG. 8 shows gain curves of the high bandwidth CTLE circuit of FIG. 5 in accordance with one or more embodiments.

The CTLE 502 provides a coarse tuning while the gain circuit 504 provides a fine tuning. In one example, The CTLE 502 may provide two gain settings and the degeneration resistor Re may provide four different gain setting. As a result, the high bandwidth CTLE 600 can provide 8 (=2×4) DC gain step. More gain settings may be provided in other examples. FIG. 8 shows the AC simulation 700 of the high bandwidth CTLE 600. The AC simulation 70 shows eight tuning steps with roughly 1 dB per step. Frequency is represented on X-axis and the gain is represented on Y-axis. In this example, the CTLE 502 provides 2 different DC gain, −3 dB and −7 dB. The feedback loop 510 including the gain circuit 504 and the feedback circuit 506 achieves 0 dB, −1 dB, −2 dB and −3 dB fine tuning. DC Gain is the gain at low frequency, e.g., 100 MHz, peaking gain is the gain at Nyquist frequency, e.g., 10 GHz. 41 is the peaking gain at frequency f1 and Δ2 is peaking gain at the frequency f2. Peaking gain (dB) is the difference between AC gain (dB) and DC gain (dB) for the CTLE transfer function. If specified as a scalar, the peaking gain is converted to match the length of DC gain (dB), AC gain (dB), and Peaking frequency (Hz) by scalar expansion.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A high bandwidth continuous time linear equalization (HBCTLE) circuit, comprising:
    a continuous time linear equalization (CTLE) circuit;
    a gain circuit coupled with an output of the CTLE circuit, wherein the gain circuit includes a first transistor pair; and
    a feedback circuit coupled between the output of the CTLE circuit and an output of the gain circuit, wherein the feedback circuit includes a second transistor pair, wherein bases or gates of transistors in the second transistor pair are coupled with the output of the gain circuit.

2. The HBCTLE circuit of claim 1, wherein bases or gates of transistors in the first transistor pair are coupled with the output of the CTLE circuit.

3. The HBCTLE circuit of claim 1, wherein the feedback circuit includes a third transistor pair, wherein bases or gates of transistors in the third transistor pair are coupled with the second transistor pair.

4. The HBCTLE circuit of claim 1, wherein the feedback circuit includes a third transistor pair, wherein bases or gates of transistors in the third transistor pair are coupled with the second transistor pair through a low pass filter.

5. The HBCTLE circuit of claim 2, wherein the transistors in the first transistor pair are coupled together through a degeneration impedance.

6. The HBCTLE circuit of claim 1, wherein the transistors in the second transistor pair are coupled together through a variable degeneration impedance.

7. The HBCTLE circuit of claim 2, wherein the transistors in the second transistor pair are coupled to a low pass filter.

8. The HBCTLE circuit of claim 7, further including a third transistor pair.

9. The HBCTLE circuit of claim 8, wherein an output of the low pass filter is coupled to bases or gates of transistors of the third transistor pair.

10. The HBCTLE circuit of claim 9, wherein the third transistor pair is coupled with the output of the CTLE circuit.

11. The HBCTLE circuit of claim 1, wherein the feedback circuit is configured to provide a variable feedback factor.

12. The HBCTLE circuit of claim 1, wherein the CTLE circuit includes a transistor and a CTLE resistor, wherein the CTLE resistor is coupled between the transistor and supply voltage.

13. The HBCTLE circuit of claim 12, wherein the feedback circuit is configured such that at a frequency above a predetermined threshold, an output load impedance of the CTLE circuit is approximately equal to a value of the resistor.

14. The HBCTLE circuit of claim 1, wherein the CTLE circuit includes a passive CTLE section and an active CTLE section.

15. The HBCTLE circuit of claim 13, wherein the active CTLE section includes a degenerative impedance of an order higher than one.

* * * * *